United States Patent

Cronin et al.

[11] Patent Number: 5,530,262
[45] Date of Patent: Jun. 25, 1996

[54] BIDIRECTIONAL FIELD EMISSION DEVICES, STORAGE STRUCTURES AND FABRICATION METHODS

[75] Inventors: John E. Cronin, Milton; Kent E. Morrett, Essex Junction; Michael D. Potter, Grand Isle; Matthew J. Rutten, Milton, all of Vt.

[73] Assignee: International Business Machines Corporation, Armonk, N.Y.

[21] Appl. No.: 541,763

[22] Filed: May 25, 1995

Related U.S. Application Data

[60] Continuation of Ser. No. 206,571, Mar. 4, 1994, abandoned, which is a division of Ser. No. 951,283, Sep. 25, 1992, Pat. No. 5,312,777.

[51] Int. Cl.⁶ .................................................. H01L 29/06
[52] U.S. Cl. .......................... 257/10; 313/308; 313/336; 315/169.1
[58] Field of Search ...................... 257/10; 315/168, 315/169.1, 334, 341, 349, 350, 351; 313/308, 309, 336

[56] References Cited

U.S. PATENT DOCUMENTS

| | | | |
|---|---|---|---|
| 3,359,448 | 12/1967 | Bashara et al. | 313/326 |
| 3,748,522 | 7/1973 | Geppert | 313/310 |
| 3,755,704 | 8/1973 | Spindt et al. | 313/309 |
| 4,096,541 | 6/1978 | Bohin et al. | 313/308 |
| 4,578,614 | 3/1986 | Gray et al. | 313/309 |
| 4,594,630 | 6/1986 | Rabinowitz et al. | 361/13 |
| 4,663,559 | 5/1987 | Christensen | 313/336 |
| 4,712,039 | 12/1987 | Hong | 313/307 |
| 4,827,177 | 5/1989 | Lee et al. | 313/306 |
| 4,933,542 | 6/1990 | Bokor et al. | 257/10 |
| 4,956,574 | 9/1990 | Kane | 313/306 |
| 4,990,766 | 2/1991 | Simms et al. | 250/213 VT |
| 5,089,292 | 2/1992 | MaCaulay et al. | 313/336 |
| 5,136,205 | 8/1992 | Sokolich et al. | 313/309 |
| 5,136,764 | 8/1992 | Vasquez | 29/25.01 |
| 5,155,420 | 10/1992 | Smith | 315/349 |
| 5,173,635 | 12/1992 | Kane | 313/336 |
| 5,189,341 | 2/1993 | Itoh et al. | 315/169.1 |
| 5,218,273 | 6/1993 | Kane et al. | 315/334 |
| 5,233,263 | 8/1993 | Cronin et al. | 313/309 |
| 5,312,777 | 5/1994 | Cronin et al. | 437/195 |
| 5,432,407 | 7/1995 | Kane | 315/169.1 |

FOREIGN PATENT DOCUMENTS

1517847 7/1978 United Kingdom ................... 315/334

*Primary Examiner*—Sara W. Crane
*Assistant Examiner*—Courtney A. Bowers
*Attorney, Agent, or Firm*—Heslin & Rothenberg

[57] ABSTRACT

Bidirectional field emission devices (FEDs) and associated fabrication methods are described. A basic device includes a first unitary field emission structure and an adjacently positioned, second unitary field emission structure. The first unitary structure has a first cathode portion and a first anode portion, while the second unitary structure has a second cathode portion and a second anode portion. The structures are positioned such that the first cathode portion opposes the second anode portion so that electrons may flow by field emission thereto and the second cathode portion opposes the first anode portion, again so that electrons may flow by field emission thereto. A control mechanism defines whether the device is active, while biasing voltages applied to the first and second unitary structures define the direction of current flow. Multiple applications exist for such a bidirectional FED. For example, an FED DRAM cell is discussed, as are methods for fabricating the various devices.

23 Claims, 8 Drawing Sheets fig. 1
(PRIOR ART)

BIDIRECTIONAL FIELD EMISSION DEVICES, STORAGE STRUCTURES AND FABRICATION METHODS

This application is a continuation of application Ser. No. 08/206,571, filed Mar. 4, 1994, now abandoned, which is a division of application Ser. No. 07/951,283, filed Sep. 25, 1992, U.S. Pat. No. 5,312,777.

TECHNICAL FIELD

This invention relates in general to integrated microelectronic devices having a field emission structure and, more particularly, to novel bidirectional field emission device structures and methods of fabricating the same.

BACKGROUND ART

Field emission devices (FEDs) or micro-vacuum tubes have many advantages over conventional semiconductor silicon devices for signal and data processing. For example, FEDs are much faster switching in the terahertz regime, are temperature and radiation tolerant, and are relatively easy to construct, requiring the disposition of appropriate layers of interleaved metals and insulators above a supporting substrate. Recognized applications range from discrete active devices to high density SRAMs and displays, radiation hardened military applications and temperature insensitive space technologies, etc. The literature on field emission devices, which is extensive, principally (if not totally) focuses on unidirectional emission devices. Typically, such prior art devices include a cathode, a gate to aid in controlling the emissions of the cathode, and an anode. With only these three dedicated electrodes the resultant device is necessarily application limited.

Activity in the field of cold cathode emission at VLSI levels has been increasing in the past few years. (For example, certain novel lateral field emission device structures and methods of fabricating the same are presented in a co-pending, commonly assigned U.S. patent application Ser. No. 07/722,768, entitled "Lateral Field Emission Devices and Methods of Fabrication," the entirety of which is hereby incorporated herein by reference.) The present application is believed to further advance the state of the art by providing novel bidirectional field emission devices which more closely mirror the capabilities of a conventional, silicon-fabricated field effect transistor.

As an example of one application, a significant number of publications have proposed using certain existing field emission devices for SRAM cells. However, few (in any) proposals for using a field emission device structure for a DRAM cell have been expressed. The disadvantage to the traditional FED for use as a DRAM cell relates to its inherent unidirectional nature. By providing a bidirectional field emission device, however, a cell can be designed such that the cell state ('1' or '0') will be a stored charge on an addressable device. The device state can then be queried to ascertain the stored result.

Thus, to further continue advancement of field emission technology, a genuine need exists in the art for bidirectional field emission devices and for methods of fabricating the same. With a bidirectional FED, multiple applications become possible, including the unique use thereof in a DRAM cell structure.

DISCLOSURE OF THE INVENTION

Briefly summarized, in one basic aspect a bidirectional field emission device is provided having a first unitary field emission structure, including a first cathode portion and a first anode portion, and a second unitary field emission structure which has a second cathode portion and a second anode portion. The first unitary field emission structure and the second unitary field emission structure are adjacently disposed such that the first cathode portion is spaced from and opposes the second anode portion so that electrons may flow by field emission from the first cathode portion to the second anode portion, and such that the second cathode portion is spaced from and opposes the first anode portion so that electrons may flow by field emission from the second cathode portion to the first anode portion. A biasing mechanism for controlling the flow of electrons from the first cathode portion of the first unitary field emission structure and from the second cathode portion of the second unitary field emission structure is also provided, as are additional specific enhanced features of the basic bidirectional field emission device.

In one application, a field emission storage cell for a DRAM device is described. The storage cell includes the basic bidirectional field emission device outlined above in combination with a charge image plane which, for example, is disposed adjacent and spaced parallel to the second anode portion of the second unitary field emission structure. A dielectric material is preferably located between the second anode portion and the charge image plane such that a charge storage capacitor is defined by the second anode portion, the dielectric material and the charge image plane. The biasing mechanism controls the writing of charge to or reading of charge from this charge storage capacitor. As an enhanced application, a dual field emission storage cell for use in a DRAM device can be readily constructed by fabricating a mirror image of the basic bidirectional FED storage cell about the first anode portion of the first unitary field emission structure.

In another basic aspect, a method for forming a bidirectional field emission device is set forth. The method includes the steps of: providing a substrate having an upper surface; forming a first cathode portion above the upper surface of the substrate so as to extend substantially parallel thereto; forming a second cathode portion above the first cathode portion so as to extend substantially parallel thereto; forming a first anode portion and a second anode portion, the first anode portion being formed to couple with the first cathode portion so as to define a first unitary field emission structure, and the second anode portion being formed to couple with the second cathode portion so as to define a second unitary field emission structure, the first unitary field emission structure and the second unitary field emission structure being adjacently disposed such that the first cathode portion is spaced from and opposes the second anode portion so that electrons may flow by field emission from the first cathode portion to the second anode portion, and such that the second cathode portion is spaced from and opposes the first anode portion so that electrons may flow by field emission from the second cathode portion to the first anode portion; and, forming metallizations to apply biasing potentials to control the emission of electrons from the first cathode portion and from the second cathode portion.

Process enhancements on the basic method are also described herein. For example, a storage cell can be formed from the bidirectional field emission device with the additional steps of: forming a dielectric layer in contact with and extending parallel to the second anode portion of the second unitary field emission structure; and forming a charge image plane in contact with and extending parallel to the dielectric layer disposed adjacent the second anode portion such that a charge storage capacitor is defined by the second anode portion, the dielectric layer and the charge image plane. Thus, by controlling the flow of electrons from the first cathode portion of the first unitary field emission structure and from the second cathode portion of the second unitary field emission structure, charge can be written to or read from the charge storage capacitor.

To summarize, the present invention is directed to bidirectional field emission devices and storage structures which can be built using existing microelectronic fabrication techniques. In the preferred embodiments depicted and described herein, lateral field emission devices are built having all of the advantages set forth in the incorporated co-pending application. In addition, the disclosed bidirectional field emission structures comprise structures capable of operating in a manner more closely analogous to conventional, silicon-fabricated field effect transistor structures. The process described is readily extendable to multiple levels of vertical device integration. Further, standard interconnect approaches (contacts, vias, wiring) can be used as interconnect between a plurality of bidirectional FEDs. In a specific application, a novel bidirectional FED DRAM cell is described, along with a dual FED DRAM cell configuration based thereof which itself may comprise one storage unit of a two unit charge storage structure.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which:

FIG. 3a is a cross-sectional view of the assembly of FIG. 3 taken along line 3a—3a;

FIG. 4a is a cross-sectional view of the assembly of FIG. 4 taken along line 4a—4a;

FIG. 13a is a cross-sectional view of the assembly of FIG. 13 taken along line 13a–13a.

BEST MODE FOR CARRYING OUT THE INVENTION

Reference is now made to the drawings in which the same numerals are used throughout the different figures to designate the same or similar components.

Figure 1:
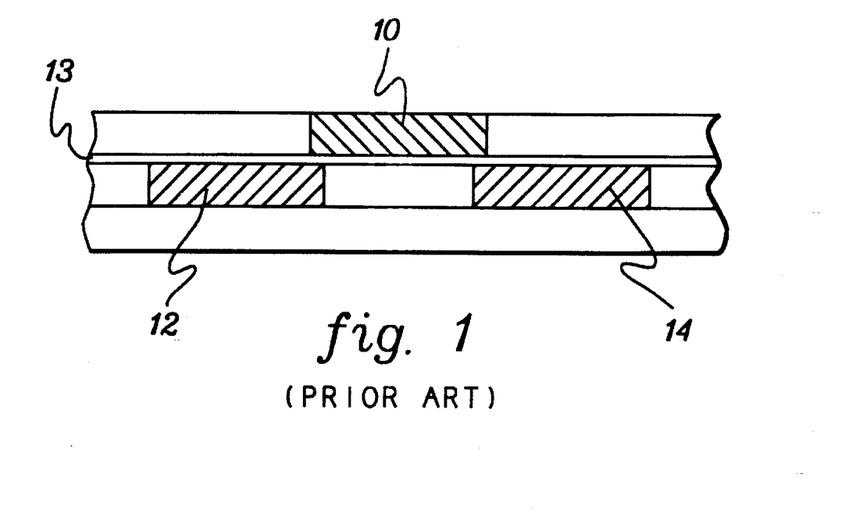
FIG. 1 is a cross-sectional view of a prior art field effect transistor.

A simplified version of a conventional field effect transistor (FET) is shown in FIG. 1. This silicon-based structure includes a gate 10 which controls the flow of electrons between a source (or drain) 12 and a drain (or source) 14, where the source and drain are separated from gate 10 by a thin dielectric material 13. The FET structure is well known in the art and is extensively employed throughout the microelectronics industry. One significant advantage of the FET structure is its bidirectional nature, i.e., electrons may flow from structure 12 to structure 14 or from structure 14 to structure 12 depending upon the biasing potentials applied to these structures and to control gate 10.

Figure 2:
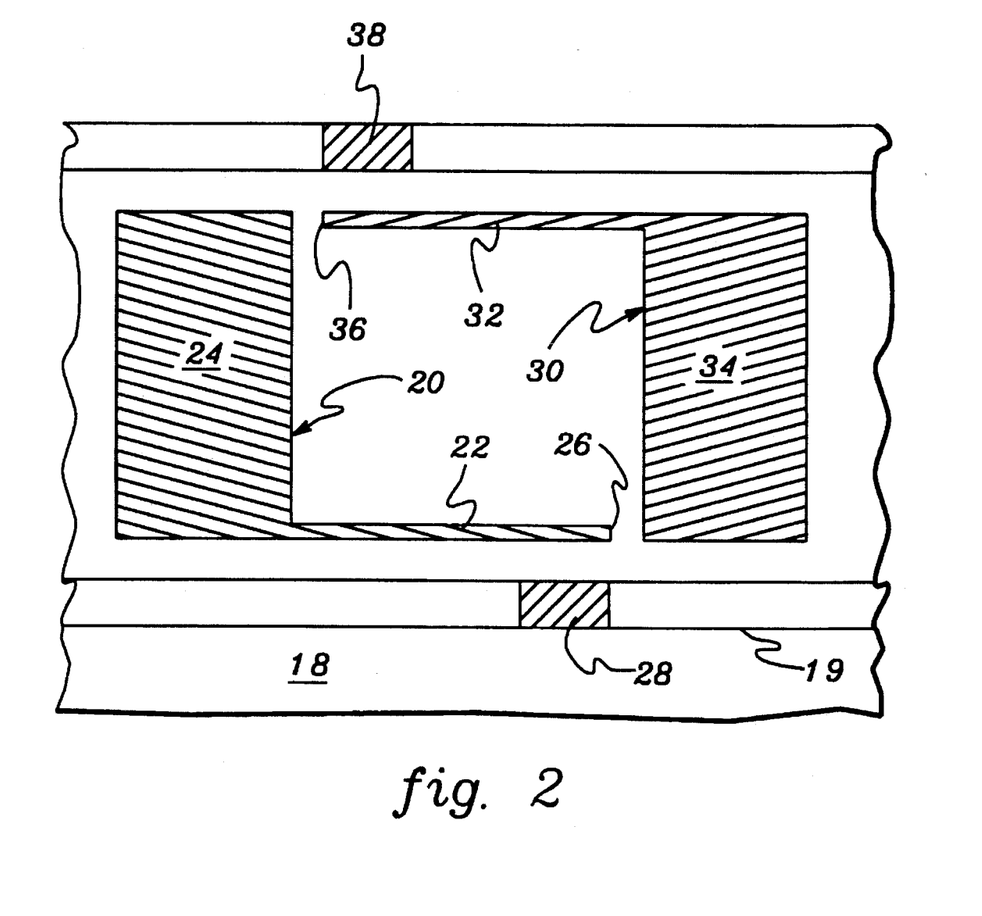
FIG. 2 is a simplified cross-sectional view of a bidirectional field emission device in accordance with the present invention.

In comparison with this FET structure, an embodiment of a bidirectional field emission device pursuant to the present invention is shown in cross-section in FIG. 2. In this simplified embodiment, a first unitary field emission structure 20 is disposed adjacent a second unitary field emission structure 30. Structures 20 & 30 each include an ultra-thin emitter or electron emitting cathode portion 22 & 32, respectively, which is disposed laterally relative to an upper surface 19 of a supporting substrate 18. Each unitary structure 20 & 30 also includes a plate or anode portion 24 & 34, respectively. Anode portion 24 is disposed adjacent a tip 36 of cathode portion 32 for collecting electrons emitted by field emission therefrom. Similarly, anode portion 34 is disposed adjacent a tip 26 of cathode portion 22, again for collecting electrons emitted therefrom by field emission.

A control gate is also provided having a first gate control or member 28 and a second gate control or member 38, which are disposed adjacent first cathode portion 22 and second cathode portion 32, respectively. (Those skilled in the art will recognize that various control gate configurations are possible. By way of further example, a single square-shaped gate member could be disposed between cathode portion 22 and cathode portion 32.) Gate members 28 & 38 operate to switch the bidirectional device 'on' or 'off', while the biasing applied to first unitary structure 20 and second unitary structure 30 determines the direction of electron flow, i.e., whether electrons are emitted from cathode portion 22 or cathode portion 32. In comparison with the FET structure of FIG. 1, note that the operation of the bidirectional FED control gate (having members 28 & 38) is analogous to the operation of gate 10 of the FET structure (FIG. 1), and that the first and second unitary field emission structures 20 & 30 can operate as anode/cathode or cathode/anode, respectively, in a manner analogous to the source/drain or drain/source structures 12 & 14 of the FET (FIG. 1).

In operation, the control gate (including members 28 & 38) is either placed at ground potential, whereby the bidirectional field emission device is 'off', or at a positive potential, wherein the device is 'on' so that electrons may flow between first unitary structure 20 and second unitary structure 30, i.e., assuming an appropriate biasing is applied to these structures. Specifically, when members 28 & 38 are at a positive potential with, for example, first unitary structure 20 at a ground potential, and second unitary structure 30 at an appropriate negative potential, electrons flow from tip 36 of cathode portion 32 to anode portion 24 of first unitary structure 20. Conversely, with the gate control maintained at a positive potential, first unitary structure 20 at an appropriate negative potential, and second unitary structure 30 at ground potential, electrons flow from tip 26 of cathode portion 22 to anode portion 34 of the second unitary field emission structure. Although a function of device geometry, a typical cathode-to-anode voltage difference may be in the range of 20 to 50 volts, while a suitable gate-to-cathode (reference) voltage difference may be 5 to 15 volts.

A detailed embodiment of a bidirectional field emission device fabrication process pursuant to the present invention is next described with reference to FIGS. 3–10.

Figure 3:
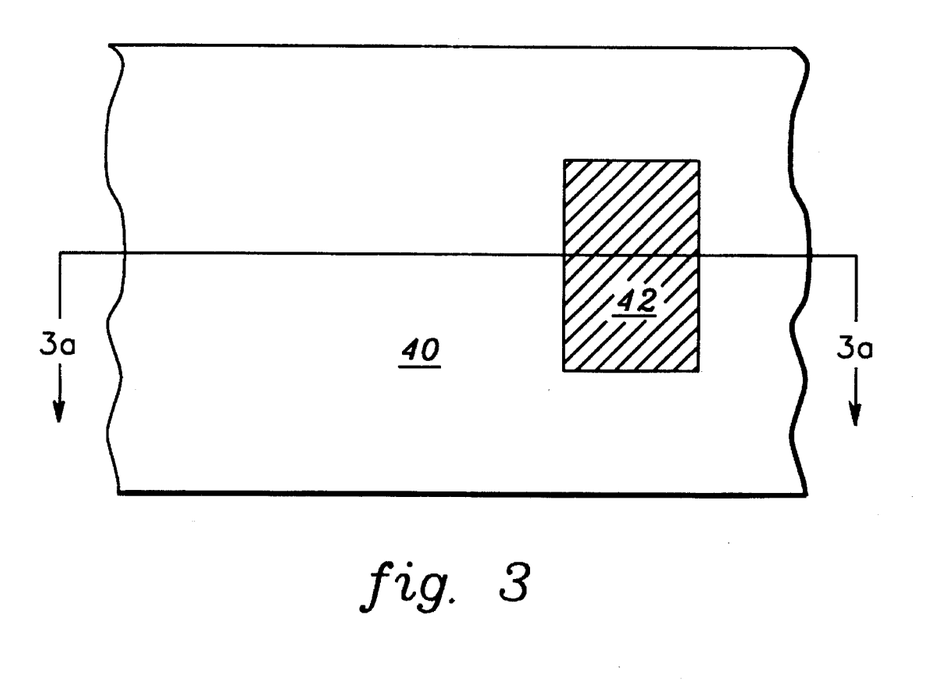
FIG. 3 is a plan view of a microelectronic assembly after initial steps in the fabrication process of a bidirectional field emission device pursuant to the present invention.
Figure 3A:
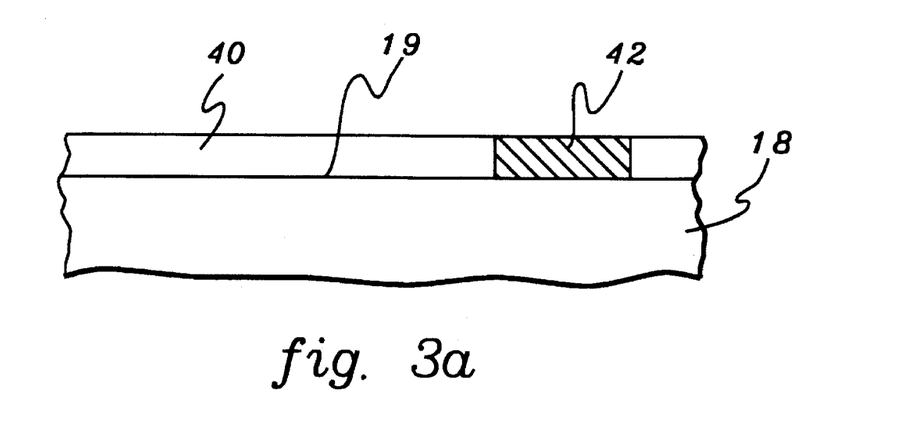

Referring first to FIGS. 3 & 3a, in one embodiment fabrication of a bidirectional field emission device begins by patterning and etching a layer of dielectric material, such as oxide 40 disposed on upper surface 19 of substrate 18. (Substrate 18 can comprise any glass, metal, ceramic, etc., capable of withstanding the elevated temperatures (e.g., 450° C.) typically encountered during the device fabrication process.) A blanket chemical vapor deposition of a conductive material, e.g., tungsten, fills area 42, which is then followed by planarization of the assembly so that the tungsten resides only in the patterned oxide opening. Such a process is known in the open literature as the damascene process. The thickness of oxide 40 and the metallization disposed therein can be selected for optimization of device characteristics. As a typical example, layer 40 may be approximately 5000 angstroms. Structure 42 will ultimately form a lower gate member within the control gate of the bidirectional field emission device. Contact to gate member 42 can be made by any conventional method. For an example, refer to the techniques described in the above-incorporated application.

Figure 4:
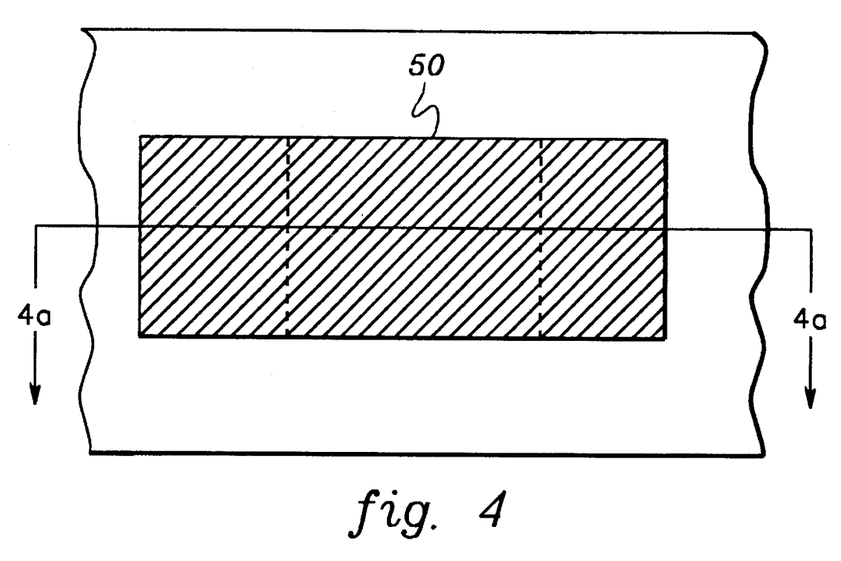
FIG. 4 is a plan view of the microelectronic assembly of FIGS. 3 & 3a after additional steps in the bidirectional FED fabrication process pursuant to the present invention.
Figure 4A:
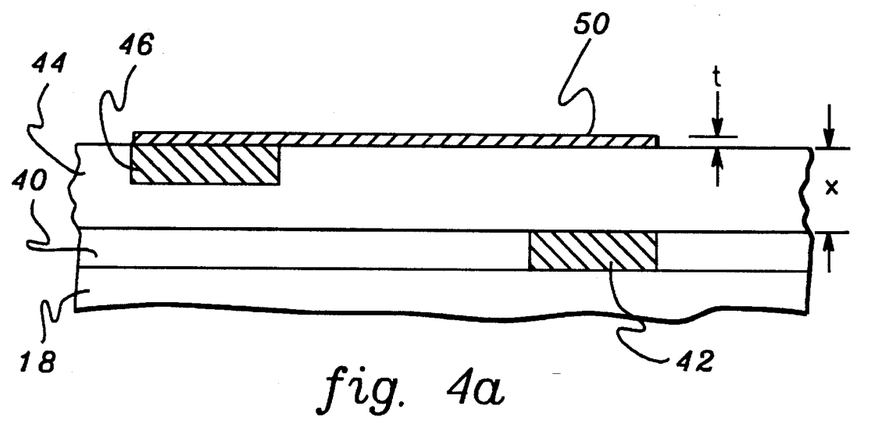

Fabrication continues to attain an assembly such as depicted in FIGS. 4 & 4a. In particular, an interlevel dielectric, for example, an oxide layer 44, is deposited and planarized. A base metal or contact pad 46 is formed in oxide 44 using the well known damascene process. (Conventional mask and etch procedures are used throughout the fabrication process unless stated otherwise.) Oxide 44 is preferably on the order of 1000 angstroms thick "x" since it will form the spacer between gate member 42 and an emitter or cathode member 50 to be formed above contact pad 46. As described below, metal contact pad 46 is used as an etch stop during anode definition and as a landing pad/contact for cathode member 50. The configuration of the mask used for etching and metallization of oxide 44 is selected to ultimately reduce the contact resistance between contact pad 46 and the subsequently formed cathode 50, and to lower the series resistance of the cathode member.

Physical vapor deposition techniques may be used to produce a thin layer of metal from which cathode 50 may be formed by masking (with, for example, photoresist) over the portion of the metal that is not to be removed while removing the exposed portion. The exposed portion is removed by subjecting the multilayer structure to a metal etching process. There are several different etching processes available to those skilled in the art. (Note that the present invention is not limited by the particular masking and etching approaches used at any of the fabrication stages discussed herein.) Laterally disposed cathode portion 50 is preferably a thin film of tungsten or titanium nitride, e.g., 50–1000 angstroms thick "t" and, preferably, 150–250 angstroms in thickness. Although not drawn to scale, cathode metallization 50 electrically contacts pad 46, and is separated from gate member 42 by the thickness "x" of oxide layer 44.

Figure 5:
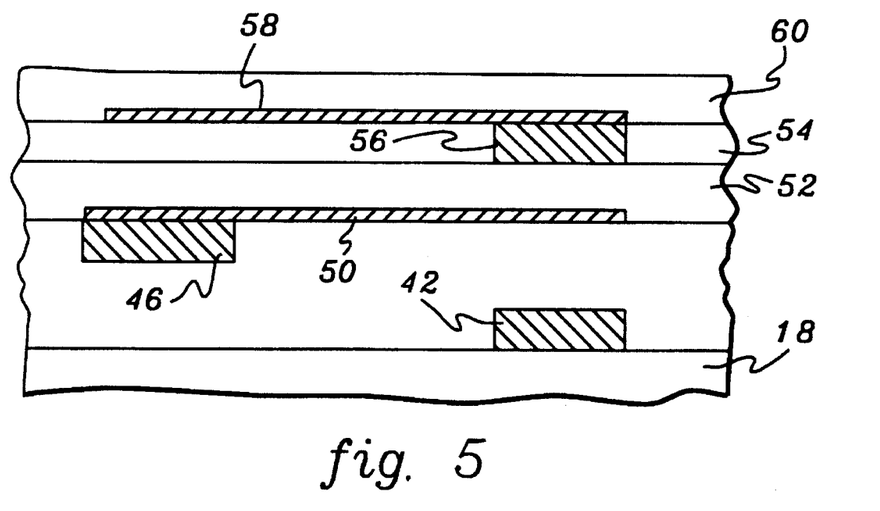
FIG. 5 is a cross-sectional view of the assembly of FIGS. 4 & 4a after further steps in the bidirectional FED fabrication process pursuant to the present invention.

Next, as shown in FIG. 5 an insulating layer 52 is formed overlying cathode member 50, another layer 54 of insulator is deposited thereon and patterned for CVD-tungsten deposition of another base plate or contact pad 56. A second very thin layer or film of metal is next defined by physical deposition techniques followed by masking and etching away of the metal at all undesired locations of the stack to produce a second cathode portion 58 within the assembly. Preferably, layer 52, and/or layers 52 & 54, comprise a removable material, such as paralyene, which is described further below. A dielectric material 60, such as oxide, is then disposed to cover the upper surface of the assembly.

Figure 6:
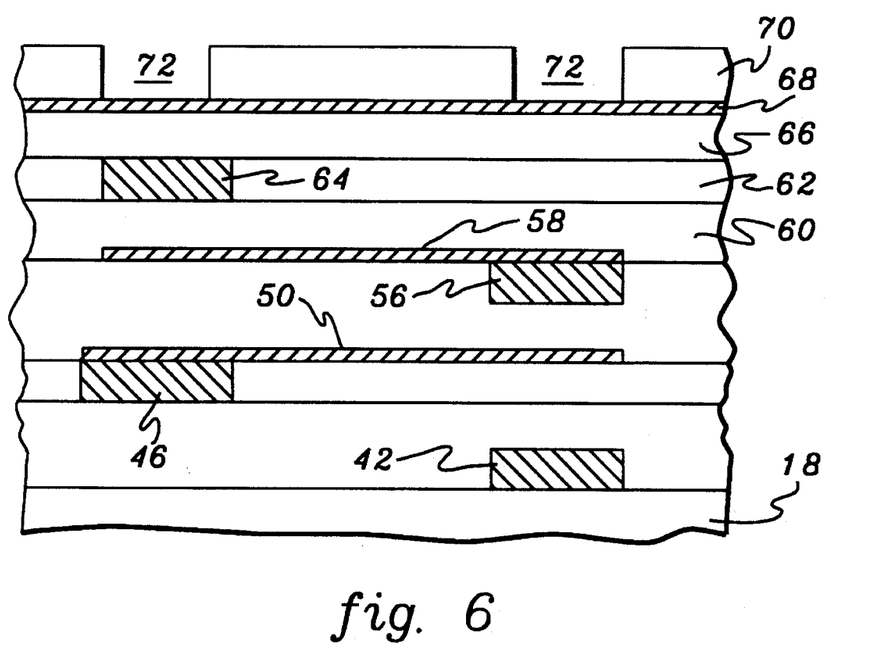
FIG. 6 is a cross-sectional view of the assembly of FIG. 5 after several additional steps in the bidirectional FED fabrication process pursuant to the present invention.

As shown in FIG. 6, the patterning and etching of a further dielectric layer 62 is accomplished to define an area 64 within which tungsten is deposited. Once appropriately accessed, metal 64 comprises an upper gate member and functions as the gate control for cathode portion 58. The dimension of gate 64 and its location relative to cathode 58 are analogous to those defined with respect to gate member 42 and cathode portion 50. An isolation oxide 66 can then be deposited to protect the stack. A solid etch stop 68, for example fabricated of 500 angstrom thick aluminum, is next deposited and a cell definition mask 70 is imaged with openings 72. Although not necessary, the left and right openings 72 are shown to be of equal size.

Figure 7:
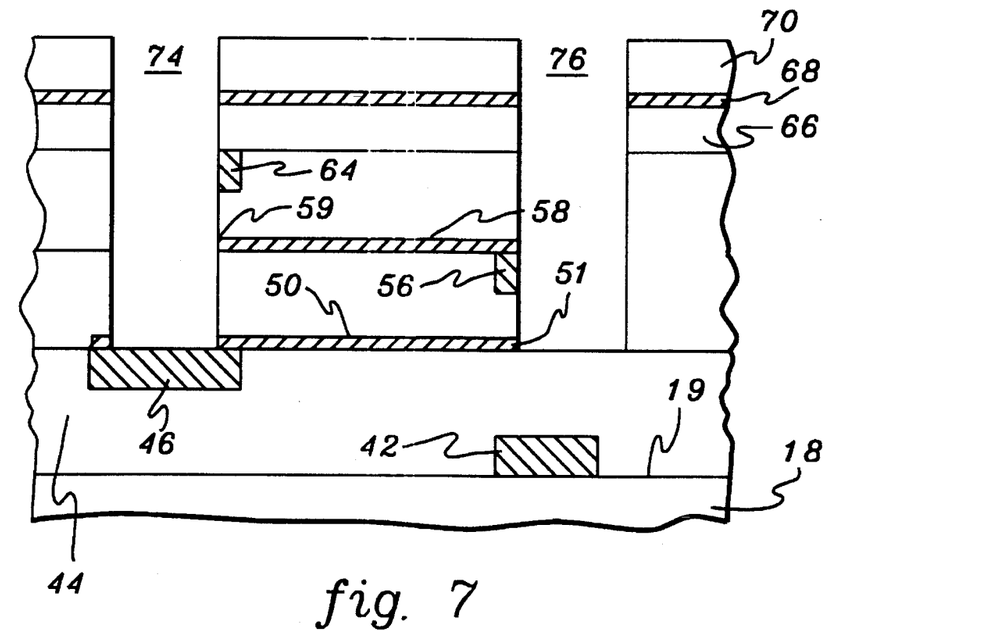
FIG. 7 is a cross-sectional view of the assembly of FIG. 6 after trench openings have been partially formed therein in accordance with the bidirectional FED fabrication process of the present invention.
Figure 7A:
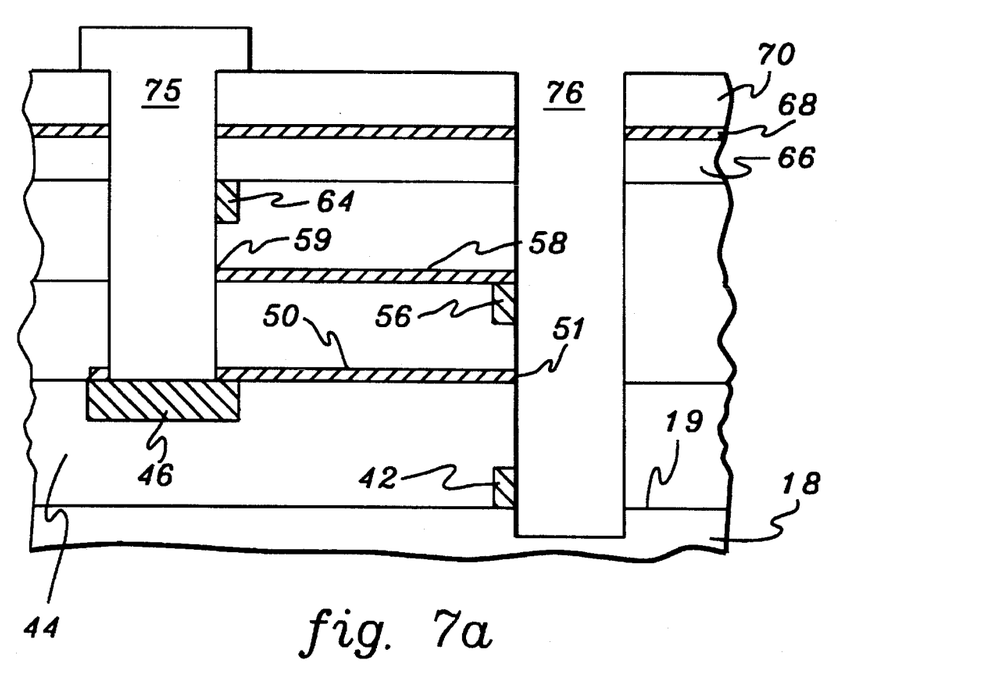
FIG. 7a is a cross-sectional view of the assembly of FIG. 7 after additional, selective trench etching in accordance with the bidirectional FED fabrication process of the present invention.

FIG. 7 depicts the assembly after partial etching of two trenches 74 & 76 therein. The left trench 74 is complete and terminates on contact pad 46, while the right trench 76 must be further etched below the lower gate member 42. In order to stop etching at contact pad 46 while continuing etching down through grid 42, an interim step is required. As shown in FIG. 7a, once the etching of holes 74 & 76 has reached insulator 44 (and therefore contact pad 46), a sacrificial resist material is spun applied. A mask is used to etch the resist in hole 46 while leaving resist 75 in hole 74. The etching of hole 76 can then continue through layer 44 and gate member 42.

Openings 74 & 76 are formed to receive the anode portions of the respective unitary field emission structures. Note also that the etched openings simultaneously 'align' the edges of gates 42 & 64 with the tips (51, 59) of cathode members 50 & 58, respectively, at a first common plane (the left sidewall of opening 76) and a second common plane (the right sidewall of opening 74), both of which are substantially orthogonal to the upper surface of the supporting substrate 18.

Figure 8:
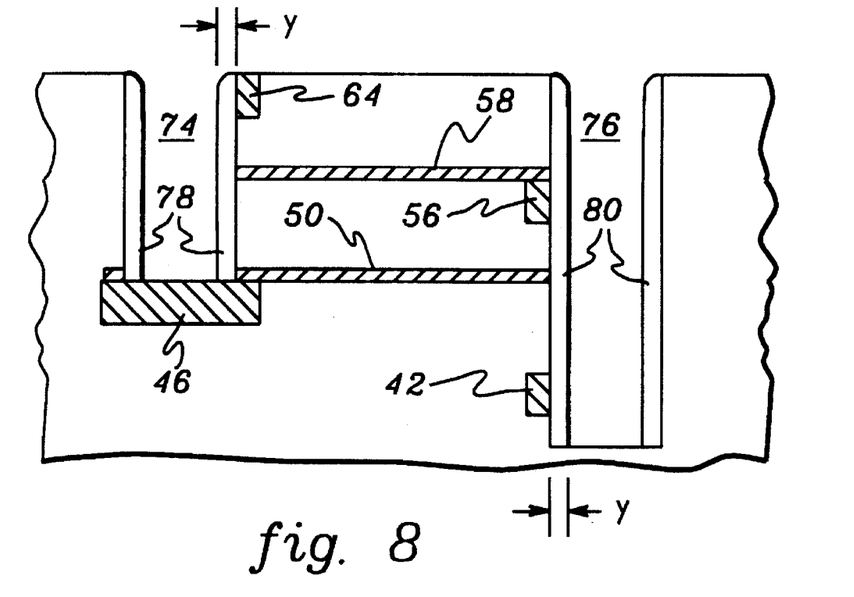
FIG. 8 is a cross-sectional view of the assembly of FIG. 7 after a conformal layer has been deposited and etched pursuant to the bidirectional FED fabrication process of the present invention.

Next, a thin conformal layer of spacer material, for example, paralyene or silicon nitride, is deposited and undirectionally etched so that spacer material 78 & 80 remains only on the vertical sidewalls of openings 74 & 76, respectively (see FIG. 8). The thickness of this spacer material is very exactly controlled since it will constitute the distance between the cathode portions and the respective anode portions of the two adjacently disposed unitary structures. Although not drawn to scale, the distance 'y' between each cathode and its opposing anode (yet to be constructed), i.e., the thickness of the spacer material, is 1–10 times and preferably at least 5–10 times the width 'x' of insulating layers 44 & 60 separating cathodes 50 & 58 from gate controls 42 & 64, respectively. Thus, in one embodiment, distance 'y' may be 0.1–1 micron. (Note that the drawings are not drawn to scale.)

Figure 9:
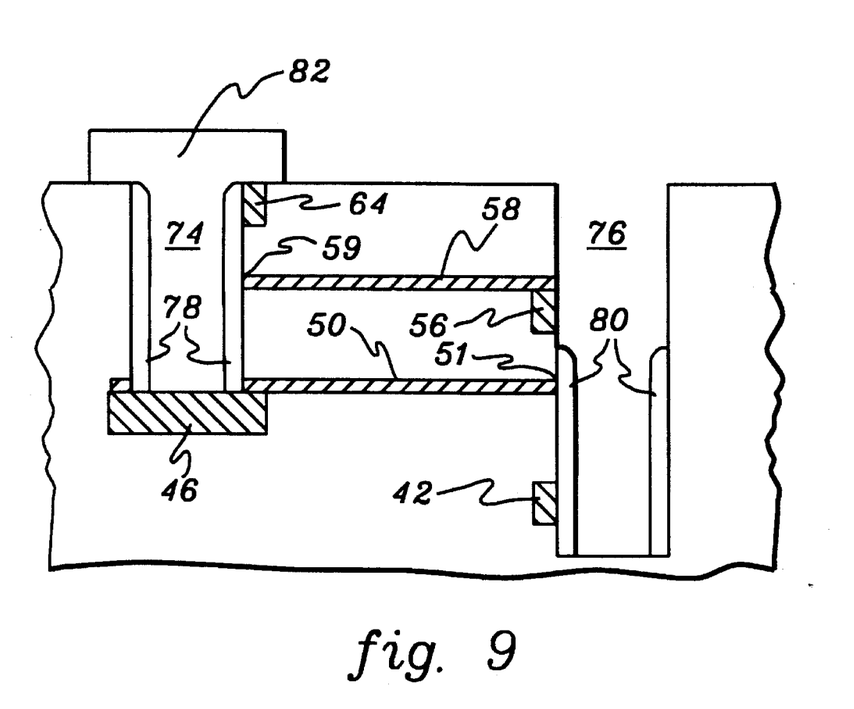
FIG. 9 is a cross-sectional view of the assembly of FIG. 8 after additional selective conformal layer etching pursuant to the bidirectional FED fabrication process of the present invention.

As shown in FIG. 9, a block mask 82 is next formed in opening 74 and spacer material 80 in opening 76 is subsequently recessed back below cathode portion 58 and, preferably below contact pad 56, (to allow the subsequently formed anode portion 84 (FIG. 10) to make electrical contact therewith such that a unitary field emission structure is formed thereby). This ability to selectively etch spacer material on the sidewalls of only one of the openings is important to fabrication of the device present herein. After removing mask 82, CVD tungsten is deposited and planarized to form the right and left anode portions 84 & 86, respectively, depicted in FIG. 10. Thus, a first unitary field emission structure is formed by anode portion 86, base contact 46 & cathode portion 50, while a second unitary field emission structure is defined by anode portion 84, contact pad 56 and cathode 58. Note that the tip 51 of cathode portion 50 is spaced from the anode portion 84 of the second unitary field emission structure by the spacer 80 thickness, and that the tip 59 of cathode portion 58 is spaced from the anode portion 86 of the first unitary field emission structure by the spacer 78 thickness.

Figure 10:
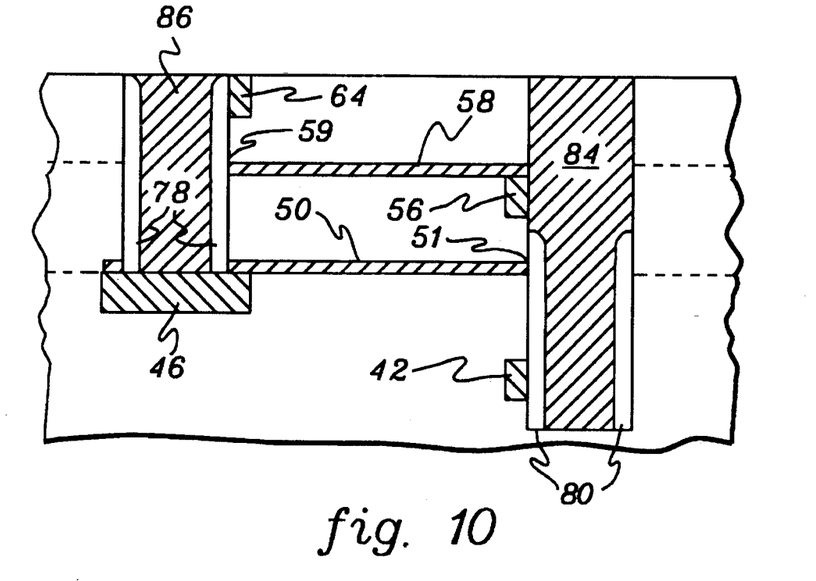
FIG. 10 is a cross-sectional view of a substantially complete bidirectional FED pursuant to the present invention.

Preferably, paralyene spacer 78, along with the paralyene disposed between cathode portion 50 and cathode portion 58, and paralyene spacer 80 is next removed (evaporated) by the application of heat (e.g., 200° C.) in the presence of oxygen. In particular, the field emission device can be sealed with another dielectric layer (not shown) and an opening provided therein to expose only paralyene spacer 78, which then allows the interconnected and buried paralyene material to be completely removed. In addition, vacuum pressure may be created in the space defined once the paralyene is removed. As a final step, the opening in the covering dielectric layer (not shown) used to access the paralyene material is sealed and the oxide is further patterned for the deposition of separate metallization contacts to anode portion 84, anode portion 86, and to gate members 42 & 64, for the application of biasing potentials to these structures. Again, depending upon the applied biasing potentials, the first unitary field emission structure may comprise either the emitter or the collector of the bidirectional field emission device, while the second unitary field emission structure will comprise the other of the collector and the emitter for the device. In this way, each of the two structures can be switched between emitter and collector so that the device is truly bidirectional.

One potentially significant application for the above-described bidirectional field emission device is in a DRAM storage structure, which is discussed below with reference to FIGS. 11–13a.

Figure 11:
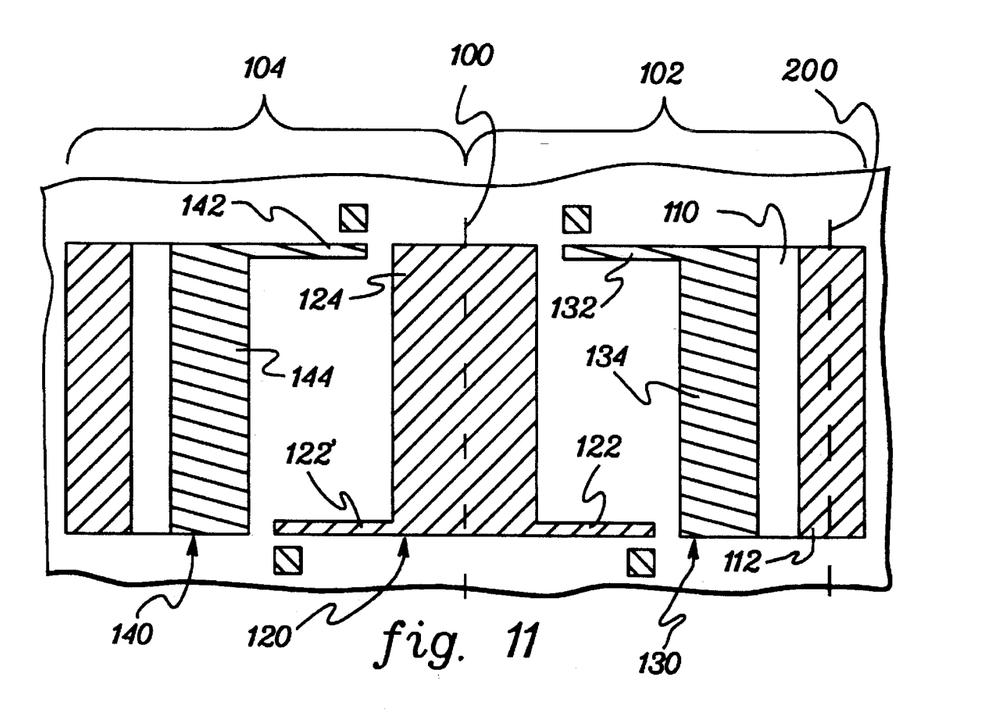
FIG. 11 is a cross-sectional view of one embodiment of a dual field emission DRAM cell pursuant to the present invention.

FIG. 11 depicts a dual storage cell configuration wherein a first storage cell 102 and a mirror image 104 thereof exist about an imaginary line 100. This dual storage cell configuration includes a first unitary field emission structure 120 having a first cathode portion 122 and a first cathode portion 122', which extend in opposite directions from an anode portion 124. To the right of first unitary field emission structure 120 is a second unitary field emission structure 130 which has an cathode portion 132 and an anode portion 134. Similarly, to the left of first unitary field emission structure 120 is a third unitary field emission structure 140 having a cathode portion 142 and an anode portion 144 Structures 122, 122', 132 & 142 each comprise an ultra-thin emitter or electron emitting cathode which is preferably disposed laterally relative to an upper surface of a supporting substrate (not shown). Each anode portion 124, 134 & 144 is disposed adjacent a tip of the cathode portion belonging to the next adjacent unitary field emission structure. Because the two storage cells are mirror images about line 100, the structure and fabrication process for only one cell is described in detail herein.

Note that as with FIG. 2, FIG. 11 is a simplified embodiment of a dual storage cell configuration. Initially, note that cell 102 (to the right of phantom line 100) is identical to the bidirectional field emission device of FIG. 2 with the exception of a vertical insulator 110 and an adjacent metallized vertical trench 112, both of which are to the right of the right-most anode portion 134 of the cell. Metallized trench 112 functions as a charge image plane and a charge storage capacitor is defined by anode portion 134 of the right-most unitary field emission structure 130, insulator 110 and charge image plane 112. Capacitive characteristics will obviously vary with the particular insulator and thickness thereof chosen for disposition between the two parallel metallized trenches 134, 112 forming the plates of the storage capacitor. Because of the bidirectional nature of the storage cell, note that charge may either be written into or read from the capacitor assembly by the application of an appropriate biasing to the left and right unitary field emission structures of cell 102. In addition, improved array density can be obtained by considering the dual storage cell configuration of FIG. 11 as a single unit with a mirror image thereof about each charge image plane, i.e., about imaginary line 200 through charge image plane 112 in which case the right-most unitary field emission structure would have two cathode portions extending therefrom, for example, from a cylindrical shaped anode portion. A similar symmetry could exist about the charge image plane associated with third unitary field emission structure 140.

Figure 12:
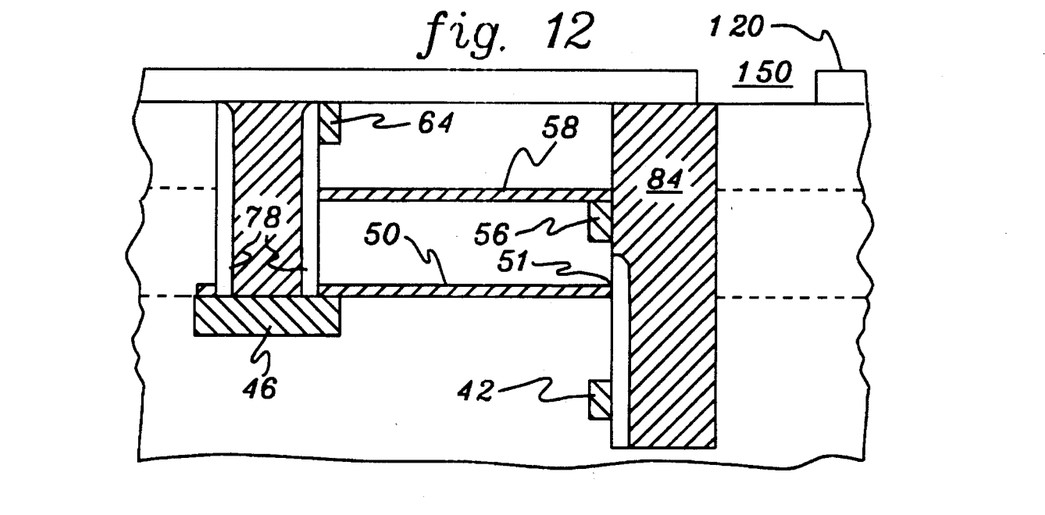
FIG. 12 is a cross-sectional view of the assembly of FIG. 10 after additional processing steps in the fabrication of an FED DRAM cell pursuant to the present invention.
Figure 13:
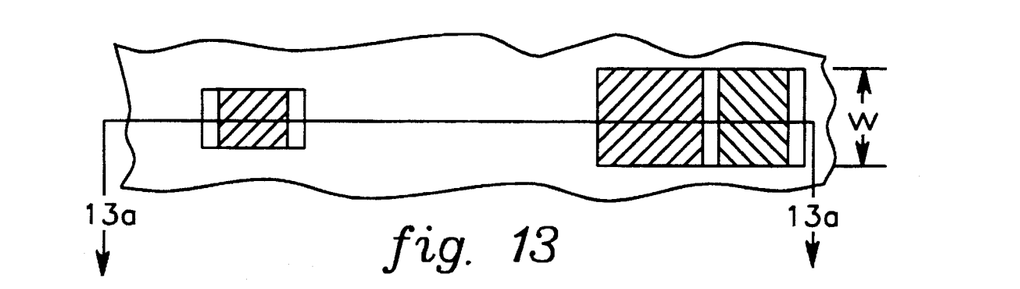
FIG. 13 is a plan view of the assembly of FIG. 12 after additional processing steps in the FED DRAM cell fabrication process pursuant to the present invention.
Figure 13A:
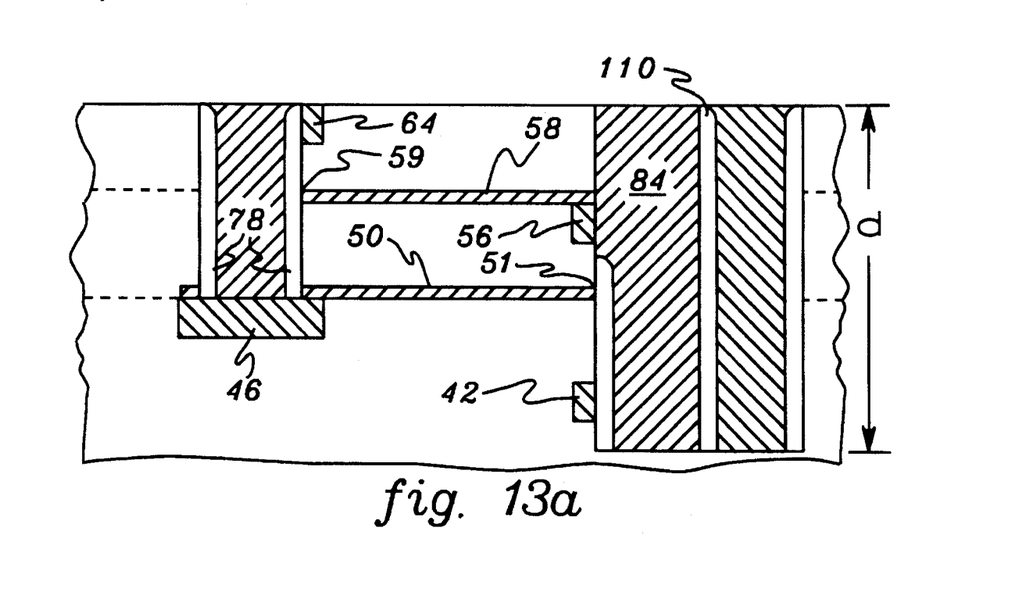

The basic storage cell structure and fabrication method is substantially identical to the bidirectional field emission device and fabrication method described above in connection with FIGS. 3–10. Thus, note that FIG. 12 is essentially FIG. 10 except that a photo mask 120 has been deposited and patterned on the upper surface of the device. Mask 120 includes an opening 122 aligned partially over a portion of metallized anode 108 of the FED. This overlap is to ensure good contact therewith. A trench is then defined of similar dimensions to anode portion 134 and a dielectric spacer, preferably comprising a high dielectric material such as oxide or silicon nitride, is conformally deposited and undirectionally etched so as to reside only on the vertical sidewalls of the trench defined below opening 150 (FIG. 12). This dielectric spacer material 110 is shown in FIGS. 13 & 13a. Thereafter, the charge image plane 112, for example, comprising tungsten, is deposited into the trench (not shown) formed in the assembly. The resultant storage cell is depicted in FIGS. 13 & 13a. The storage node of the DRAM cell is a simple parallel plate capacitor with an area defined by the width 'w' and depth 'd' of the trench processing. Capacitive values are varied by varying the dielectric material and the thickness thereof between the charge image plane 112 and the anode portion 108 of the bidirectional field emission storage cell.

From the above discussion, it should be noted that the present invention is directed to bidirectional field emission devices which can be built using existing microelectronic fabrication techniques. In the preferred embodiments depicted and described, lateral field emission devices are built having all of the advantages set forth in the incorporated co-pending application. In additional, the bidirectional field emission device comprises a structure which in operation is more closely analogous to a conventional silicon-fabricated field effect transistor. The fabrication process described is readily extendable to multiple levels of vertical device integration. Further, standard interconnect approaches (contacts, vias, wiring) can be used as interconnect between bidirectional FEDs. As a specific application, a novel bidirectional FED DRAM cell structure is described, along with a dual FED DRAM cell configuration.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. A bidirectional field emission device, comprising:

a substrate having a surface;

a first unitary field emission structure supported by said substrate having a first cathode portion of a first layer in parallel with said surface and a first anode portion;

a second unitary field emission structure supported by said substrate having a second cathode portion of a second layer in parallel with said surface and a second anode portion;

said first unitary field emission structure and said second unitary field emission structure being adjacently disposed with said first cathode portion over said second cathode portion in layered spaced relationship thereto, with said first cathode portion spaced from and opposing said second anode portion so as to enable electrons to flow by field emission from said first cathode portion of said first unitary field emission structure to said second anode portion of said second unitary field emission structure, and with said second cathode portion spaced from and opposing said first anode portion so as to enable electrons to flow by field emission from said second cathode portion of said second unitary field emission structure to said first anode portion of said first unitary field emission structure; and means for controlling the flow of electrons from said first cathode portion of said first unitary field emission structure and from said second cathode portion of said second unitary field emission structure.

2. The bidirectional field emission device of claim 1, wherein said first cathode portion includes a tip means for emitting electrons by field emission, said first cathode portion tip means being spaced a first distance y from said second anode portion of said second unitary field emission structure and wherein said second cathode portion includes a tip means for emitting electrons by field emission, said second cathode portion tip means being spaced a second distance y' from said first anode portion of said first unitary field emission structure.

3. The bidirectional field emission device of claim 2, wherein said first distance y and said second distance y' are substantially equal, y=y'.

4. The bidirectional field emission device of claim 2, wherein said control means includes:

at least one control gate disposed adjacent said first cathode portion of said first unitary field emission structure and adjacent said second cathode portion of said second unitary field emission structure for controlling electron emissions therefrom; and means for applying respective electrical bias voltages to said first unitary field emission structure, said second unitary field emission structure and said at least one control gate.

5. The bidirectional field emission device of claim 4, wherein said at least one control gate includes a first gate member disposed adjacent the tip means of said first cathode portion of said first unitary field emission structure for controlling emission of electrons therefrom, said first gate member being spaced from said first cathode portion a first distance x, wherein $x \leq y \leq 10.(x)$, and a second gate member disposed adjacent the tip means of said second cathode portion of said second unitary field emission structure for controlling emission of electrons therefrom, said second gate member being spaced from said second cathode portion a second distance x', wherein $x' \leq y' \leq 10.(x')$.

6. The bidirectional field emission device of claim 5, wherein said first distance x and said second distance x' are substantially equal, x=x'.

7. The bidirectional field emission device of claim 2, wherein said control means includes a first gate member disposed adjacent the tip means of said first cathode portion of said first unitary field emission structure for controlling emission of electrons therefrom, and a second gate member disposed adjacent the tip means of said second cathode portion of said second unitary field emission structure for controlling emission of electrons therefrom.

8. The bidirectional field emission device of claim 7, wherein said first gate member and said first cathode portion tip means are self-aligned to terminate in a first common plane orthogonal to the upper surface of said substrate, and wherein said second gate member and said second cathode portion tip means are self-aligned to terminate in a second common plane orthogonal to the upper surface of said substrate.

9. The bidirectional field emission device of claim 8, wherein said first unitary field emission structure includes a contact pad electrically connecting said first cathode portion and said first anode portion thereof.

10. The bidirectional field emission device of claim 9, wherein said second cathode portion terminates at and electrically connects to said second anode portion of said second unitary field emission structure at said first common plane orthogonal to the upper surface of said substrate.

11. The bidirectional field emission device of claim 1, wherein said first cathode portion and said second cathode portion each have a thickness in a range of 50–1000 angstroms.

12. The bidirectional field emission device of claim 11, wherein said thickness is 150–250 angstroms.

13. The bidirectional field emission device of claim 1, wherein said parallel disposed first cathode portion and second cathode portion are spaced apart, said space between said first cathode portion and said second cathode portion comprising at least partially a chamber, said chamber containing a gas or a vacuum.

14. A field emission device storage cell for use in a DRAM device, said storage cell comprising:

a first unitary field emission structure having a first cathode portion and a first anode portion;

a second unitary field emission structure having a second cathode portion and a second anode portion;

said first unitary field emission structure and said second unitary field emission structure being adjacently disposed with said first cathode portion spaced from and opposing said second anode portion so as to enable electrons to flow by field emission from said first cathode portion of said first unitary field emission structure to said second anode portion of said second unitary field emission structure, and with said second cathode portion spaced from and opposing said first anode portion so as to enable electrons to flow by field emission from said second cathode portion of said second unitary field emission structure to said first anode portion of said first unitary field emission structure;

a charge image plane disposed adjacent and spaced parallel to said second anode portion of said second unitary field emission structure;

a dielectric material disposed between said second anode portion and said charge image plane such that a charge storage capacitor is defined by said second anode portion, said dielectric material and said charge image plane; and means for controlling the flow of electrons from said first cathode portion of said first unitary field emission structure and from said second cathode portion of said second unitary field emission structure, thereby controlling writing of charge to or reading of charge from said charge storage capacitor.

15. The field emission device storage cell of claim 14, wherein said first unitary field emission structure, said second unitary field emission structure, and said defined charge storage capacitor are disposed above an upper surface of a supporting substrate with said first cathode portion and said second cathode portion each extending parallel to the upper surface of said substrate, and wherein said first cathode portion and said second cathode portion each includes a tip means for emitting electrons by field emission.

16. The field emission device storage cell of claim 15, wherein said control means includes a first gate control disposed adjacent the tip means of said first cathode portion of said first unitary field emission structure for controlling emission of electrons therefrom, and a second gate control disposed adjacent the tip means of said second cathode portion of said second unitary field emission structure for controlling emission of electrons therefrom.

17. The field emission device storage cell of claim 16, wherein said first gate control and said first cathode portion tip means are self-aligned to terminate in a first common plane orthogonal to the upper surface of said substrate, and wherein said second gate control and said second cathode portion tip means are self-aligned to terminate in a second common plane orthogonal to the upper surface of said substrate.

18. The field emission device storage cell of claim 15, wherein said second anode portion, said dielectric material and said charge image plane are disposed within adjacent vertical trenches, each trench being substantially orthogonal to the upper surface of said supporting substrate.

19. The field emission device storage cell of claim 14, wherein said storage cell comprises a first storage cell, and wherein said first storage cell is further in combination with a second field emission device storage cell which comprises a mirror image of said first storage cell about the first anode portion of said first unitary field emission structure of said first storage cell such that first and second charge storage capacitors are defined and such that said first storage cell and said second storage cell share a common first unitary field emission structure.

20. A dual field emission storage device having dual charge storage capacitors for use in a DRAM device, said dual storage device comprising:

a first unitary field emission structure having a first cathode portion, a first cathode portion, and a first anode portion;

a second unitary field emission structure having a second cathode portion and a second anode portion;

said first unitary field emission structure and said second unitary field emission structure being adjacently disposed with said first cathode portion spaced from and opposing said second anode portion so as to enable electrons to flow by field emission from said first cathode portion of said first unitary field emission structure to said second anode portion of said second unitary field emission structure, and with said second cathode portion spaced from and opposing said first anode portion so so as to enable electrons to flow by field emission from said second cathode portion of said second unitary field emission structure to said first anode portion of said first unitary field emission structure;

a third unitary field emission structure having a third cathode portion and a third anode portion;

said first unitary field emission structure and said third unitary field emission structure being adjacently disposed with said first cathode portion spaced from and opposing said third anode portion so as to enable electrons to flow by field emission from said first cathode portion of said first unitary field emission structure to said third anode portion of said third unitary field emission structure, and with said third cathode portion spaced from and opposing said first anode portion so as to enable electrons to flow by field emission from said third cathode portion of said third unitary field emission structure to said first anode portion of said first unitary field emission structure;

a first charge image plane disposed adjacent and spaced parallel to said second anode portion of said second unitary field emission structure, and a second charge image plane disposed adjacent and spaced parallel to said third anode portion of said third unitary field emission structure;

a first dielectric material disposed between said second anode portion and said first charge image plane whereby a first charge storage capacitor is defined by said second anode portion, said first dielectric material, and said first charge image plane, and a second dielectric material disposed between said third anode portion and said second charge image plane whereby a second charge storage capacitor is defined by said third anode portion, said second dielectric material, and said second charge image plane; and means for controlling the flow of electrons from said first cathode portion and said first cathode portion of said first unitary field emission structure, from said second cathode portion of said second unitary field emission structure, and from said third cathode portion of said third unitary field emission structure, thereby controlling writing of charge to or reading of charge from said first charge storage capacitor and said second charge storage capacitor.

21. A dual access field emission storage device having a single charge storage capacitor for use in a DRAM device, said dual access storage device comprising:

a first unitary field emission structure having a first cathode portion and a first anode portion;

a second unitary field emission structure having a second cathode portion, a second cathode portion and a second anode portion;

said first unitary field emission structure and said second unitary field emission structure being adjacently disposed with said first cathode portion spaced from and opposing said second anode portion so as to enable electrons to flow by field emission from said first cathode portion of said first unitary field emission structure to said second anode portion of said second unitary field emission structure, and with said second cathode portion spaced from and opposing said first anode portion so as to enable electrons to flow by field emission from said second cathode portion of said second unitary field emission structure to said first anode portion of said first unitary field emission structure;

a third unitary field emission structure having a third cathode portion and a third anode portion;

said second unitary field emission structure and said third unitary field emission structure being adjacently disposed with said second cathode portion spaced from and opposing said third anode portion so as to enable electrons to flow by field emission from said second cathode portion of said second unitary field emission structure to said third anode portion of said third unitary field emission structure, and with said third cathode portion spaced from and opposing said second anode portion so as to enable electrons to flow by field emission from said third cathode portion of said third unitary field emission structure to said second anode portion of said second unitary field emission structure;

a charge image plane disposed adjacent to said first anode portion of said first unitary field emission structure;

a dielectric material disposed between said first anode portion of said first unitary field emission structure and said charge image plane whereby a charge storage capacitor is defined by said first anode portion, said dielectric material, and said charge image plane; and means for controlling the flow of electrons from said first cathode portion of said first unitary field emission structure, from said second cathode portion and said second cathode portion of said second unitary field emission structure, and from said third cathode portion of said third unitary field emission structure, thereby controlling writing of charge to or reading of charge from said charge storage capacitor.

22. The bidirectional field emission device of claim 4, wherein said at least one control gate includes:

a first gate member of a third layer in parallel with said surface disposed adjacent the tip means of said first cathode portion in layered spaced relationship above/below said first cathode portion for controlling emissions of electrons therefrom; and a second gate member of a fourth layer in parallel with said surface disposed adjacent the tip means of said second cathode portion in layered spaced relationship below/above said second cathode portion, for controlling emission of electrons therefrom.

23. The bidirectional field emission device of claim 22, wherein said third and fourth layers are external to the region intermediate said first and second layers.

* * * * *

UNITED STATES PATENT AND TRADEMARK OFFICE
CERTIFICATE OF CORRECTION

PATENT NO.: 5,530,262

DATED: Jun. 25, 1996

INVENTOR(S): Cronin et al.

It is certified that error appears in the above-identified patent and that said Letters Patent is hereby corrected as shown below:

Column 10, line 21, delete "x' ≤ y' ≤ 10.(x')" and substitute therefor $-- x \leq y \leq 10 \cdot (x) --$ Column 10, line 26, delete "x' ≤ y' ≤ 10.(x')" and substitute therefor $-- x \leq y \leq 10 \cdot (x) --$ Column 12, line 11, delete "first" (1st occurrence) and substitute --first'--

Column 12, line 33, delete "first" and substitute therefor --first'--.

Column 12, line 35, delete "first" and substitute therefor --first'--.

Column 12, line 61, delete "first" and substitute therefor --first'--.

Column 13, line 9, delete at first occurrence "second" and substitute therefor --second'--.

Column 13, line 30, delete "second" and substitute therefor --second'--.

Column 13, line 32, delete "second" and substitute therefor --second'--.

Column 14, line 14, delete "second" and substitute therefor --second'--.

Signed and Sealed this

Thirty-first Day of December, 1996

Attest:

BRUCE LEHMAN

Attesting Officer

Commissioner of Patents and Trademarks